United States Patent

Sewell

[15] 3,651,423

[45] Mar. 21, 1972

[54] LOGIC DEVICE EMPLOYING LIGHT-CONTROLLED GUNN-EFFECT OSCILLATIONS

[72] Inventor: Kenneth G. Sewell, Palo Alto, Calif.

[73] Assignee: Advanced Technology Center, Inc., Grand Prairie, Tex.

[22] Filed: June 24, 1970

[21] Appl. No.: 49,409

[52] U.S. Cl. ............................331/66, 250/211 R, 307/311, 317/234 V, 317/235 N, 331/107 G, 332/52

[51] Int. Cl. ............................H03b 7/00

[58] Field of Search ..................331/107 G, 66; 307/311, 312; 317/234 V, 235 N; 250/211 R, 211 J; 332/52

[56] References Cited

UNITED STATES PATENTS

| | | | |
|---|---|---|---|
| 3,538,451 | 11/1970 | Haydl | 331/66 |
| 3,555,282 | 1/1971 | Yanai et al. | 250/211 |

FOREIGN PATENTS OR APPLICATIONS

| | | | |
|---|---|---|---|
| 1,116,169 | 6/1968 | Great Britain | 331/107 G |

OTHER PUBLICATIONS

Dumke, " Microwave Oscillator," IBM Technical Disclosure Bulletin, Vol. 8, No. 11, Apr. 1966, pp. 1,646– 1,647.

Hakki et al., " Microwave Phenomena in Bulk GaAs," IEEE Transactions on Electron Devices, Vol. ED–13, Jan. 1966, pp. 94–96.

Denker, " Rational Design of Gunn and L.S.A. Diode Electrodes," Electronics Letters, Vol. 4, July 12, 1968, pp. 294–295.

*Primary Examiner*—Roy Lake
*Assistant Examiner*—Siegfried H. Grimm
*Attorney*—Charles W. McHugh

[57] ABSTRACT

Disclosed is a Gunn-effect device which is sensitive to light, comprising a semiconductor such as a crystal of N-type gallium arsenide having high-resistance, alloyed contacts of, for example, indium and gold, characterized by the capability of being switched on and off by regulating the bias voltage across the crystal and the incident light on narrow portions of the crystal. In particular, incident light on the domain-forming and domain-terminating portions of the crystal is adjusted as to selectively foster or inhibit oscillation of the crystal.

7 Claims, 8 Drawing Figures

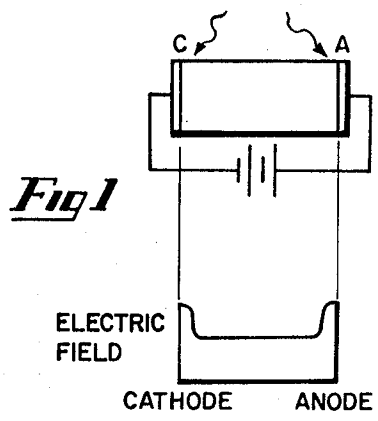
Fig 1, Fig 2
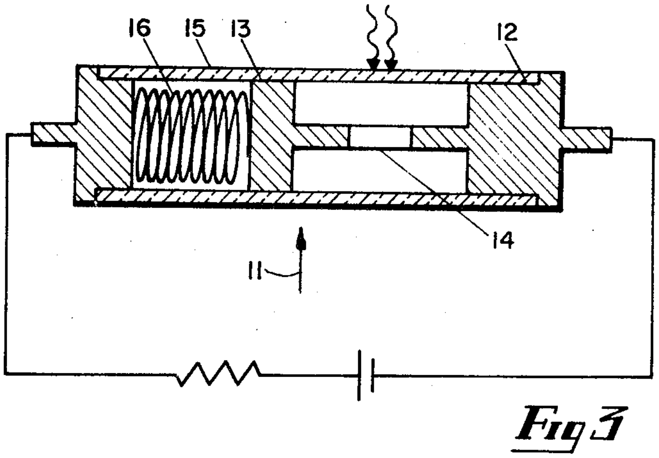
Fig 3
| INITIAL BIAS IN CATHODE REGION | LIGHT AT CATHODE REGION | LIGHT AT ANODE REGION | OSCILLATIONS ? |
|---|---|---|---|
| ABOVE $E_t$ | OFF | OFF | YES |
| ABOVE $E_t$ | ON | OFF | NO |
| ABOVE $E_t$ | ON | ON | YES |
| ABOVE $E_t$ | OFF | ON | YES |
| BELOW $E_t$ | OFF | OFF | NO |
| BELOW $E_t$ | OFF | ON | YES |
| BELOW $E_t$ | ON | ON | NO |
| BELOW $E_t$ | ON | OFF | NO |
Fig 7
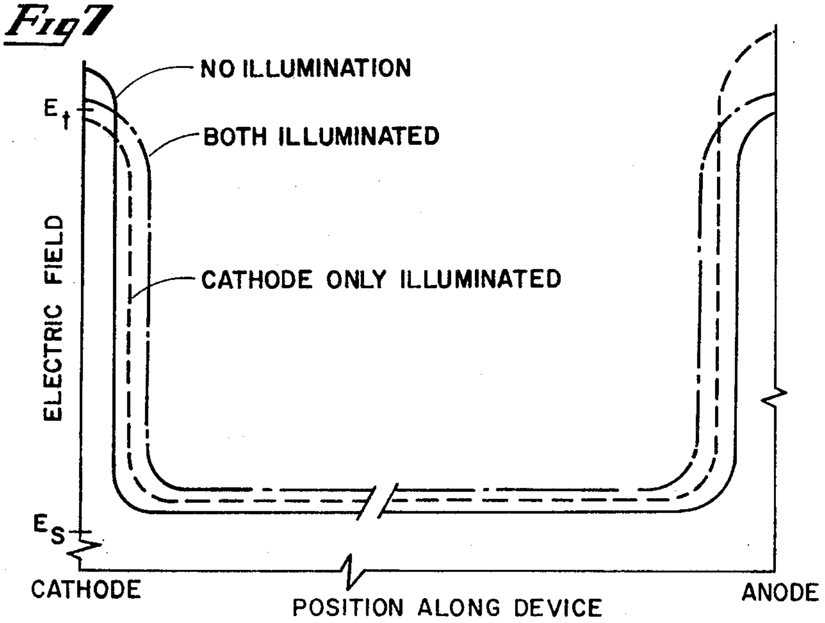
Fig 6
KENNETH G. SEWELL,
INVENTOR
BY [signature]
ATTORNEY

KENNETH G. SEWELL,
INVENTOR

BY Charles W. McHugh
ATTORNEY

LOGIC DEVICE EMPLOYING LIGHT-CONTROLLED GUNN-EFFECT OSCILLATIONS

This invention relates to light-sensitive devices, and more particularly to electro-optic devices comprising bulk semiconductors commonly known as Gunn oscillators.

This invention generally relates to Gunn-effect devices, so named after J. B. Gunn of International Business Machines Corporation, who, in 1963, first discovered that a tiny crystal of N-type gallium arsenide emits microwaves (radiation having a frequency in the region of approximately 1 to 100 gHz) when biased to an appropriate voltage level. Gunn found that the inverse of the observed frequency was approximately the time required for an electron to traverse the sample at the applied voltage, and that the critical voltage necessary to induce oscillation (i.e., the threshold voltage) was roughly proportional to the length of the specimen. Since the applied voltage divided by the length of the charged specimen equals the electric field existing in the specimen, these observations suggested that the appearance of the effect is solely dependent on electric field. Through a series of experiments, Gunn verified that the onset of the oscillation is determined by a critical electric field regardless of how much current was passing through the sample.

Of the several explanations first offered for the Gunn effect, the following is presently accepted as correct. In some semiconductors, current passing through them initially increases as the voltage is increased, but then begins to decrease with a further increase in voltage. Finally, a still further increase in voltage causes the current to resume rising. The region of increasing voltage where the current decreases is a region of negative differential resistance, since the slope of the current-voltage curve has changed from positive to negative. This phenomenon has significant utility because is is well known in the art that a circuit can be designed in which a negative differential resistance component will cause the system to oscillate.

The appearance of negative differential resistance in a semiconductor is based on the existence of empty electron energy-levels whose energy-values are higher than those occupied by conduction electrons, and on the fact that these higher energy levels have the property that electrons occupying them are less mobile under the influence of an electric field than they are in their normal state at the lower energy level. As an increasing electric field is applied to a semiconductor with this property, those electrons which are excited from the initial level or band into a higher band effectively drop out of the conduction process. If the rate at which electrons are removed from the conduction process is high enough, the current falls even as the electric field is increased. The energy bands of certain compound semiconductors such as gallium arsenide, indium phosphide and gallium antimonide approximate these requirements. If a voltage is applied in the negative differential resistance region, the crystal does not remain electrically homogeneous but breaks up onto regions having different electric fields. More particularly, a small domain forms in the sample within which the field is very high, whereas outside this domain, in the rest of the sample, the electric field has a relatively small value. Such a high-field domain moves across the sample in the general direction from one electrode to the other. As each domain disappears at the anode, a new one nucleates, generally near the cathode.

For a long time, it had been accepted that a Gunn-effect device had a transit-time frequency which was solely determined by the length of the specimen between the electrodes and which was substantially independent of temperature and the intensity of incident light. However, recently it has been shown that domains can be formed at locations other than the cathode. For example, they can be formed in the middle of the device by inhomogeneously illuminating the sample with appropriate temperature control.

The Gunn-effect, being a bulk effect, as contrasted to one derived from the instantaneous potential at a narrow barrier within semiconductor material, could prove to be of significant importance if somehow the bulk effect might be used to perform, within a single device, electronic functions which at present require many discrete junction devices or very complex integrated circuits.

Accordingly, it is an object of the invention to provide a new and simple way of performing complex electronic functions.

Another object is to provide a logic device wherein the electrical state of the device is derived entirely from bulk effects.

Yet another object is to provide a means for performing electronic functions, taking advantage of the simplicity of bulk effect devices.

Other objects and advantages of the invention will be apparent from the specification and claims and from the accompanying drawing illustrative of the invention wherein:

FIG. 1 is a schematic representation of a crystal oscillator;

FIG. 2 is a plot of electric field distribution as a function of crystal length for an exemplary oscillator in accordance with this invention;

FIG. 3 is a cross-sectional view of a construction for holding a crystal so as to permit it to be selectively illuminated along its length;

FIG. 6 is a plot of electric field distribution along an experimental oscillator for three different conditions of illumination;

FIG. 7 is a truth table for the modes of operation of an oscillator in accordance with this invention.

A device constructed in accordance with the invention includes a Gunn-effect oscillator having two spaced high-resistance regions, plus at least one light source, and a means of applying and controlling the electrical field in the oscillator. The oscillator preferably consists of a crystal of N-type gallium arsenide with an ohmic, alloyed contact (electrode) of, for example, indium and gold on each end. The oscillator can be made to switch on and off by controlling the presence and even the relative intensity of light impinging on the high-resistance regions of the oscillator. Generally, the switching action can be routinely accomplished with a light source capable of providing several microwatts of optical power on the oscillator. An ordinary two-cell flashlight has been conveniently employed in the laboratory to effect switching.

Figure 8:
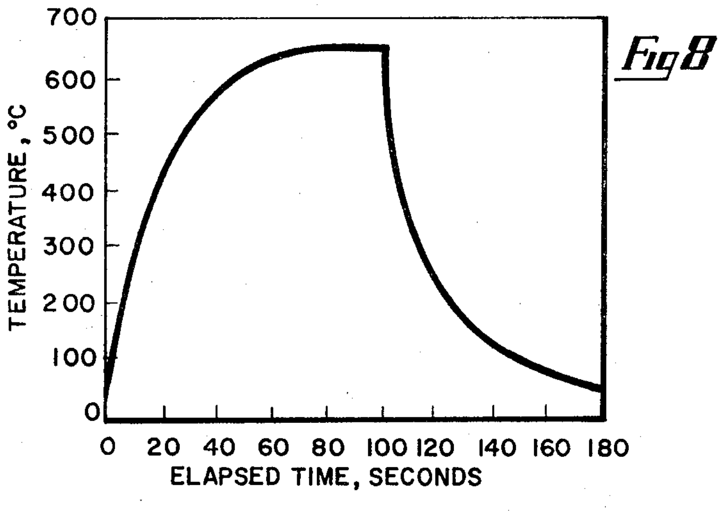
FIG. 8 is the time/temperature history of the heating process employed to obtain high-resistance regions in the ends of a semiconductor crystal.

To help explain the invention, the construction of actual oscillators and the results of certain experiments will now be described. N-type GaAs material suitable for fabricating Gunn oscillators was obtained from the Monsanto Chemical Co. The material was boat-grown, oxygen-doped, and had a resistivity of 2.1 ohm-centimeter with a mobility of 6,000 $cm.^2$/volt-second. Each oscillating crystal consisted of a rectangular parallelepiped chip which was 1.0 millimeter in length and 500 microns by 500 microns in cross section. The chips were formed by taking a 1.0 mm. wide slice from a wafer of the GaAs material which had a thickness of 0.50 mm. Each slice was then boiled in acetone to remove any wax, etc., and also boiled in ethanol to remove any oxides. The slices were next etched for about 1 minute per side in a bath of $3H_2SO_4$; $1H_2O_2$; $1H_2O$. They were then rinsed in water and dried in a vacuum dessicator. Special high-resistance, ohmic contacts were applied to the two sides of the slice which were spaced apart by the 1.0 mm. dimension. The contacts were applied by suitable masking and vacuum deposition of approximately a 0.1 micron layer of indium (In) on the two opposite sides of the slice, and subsequently depositing a few (e.g., 2 or 3 ) hundred angstroms of gold (Au) so as to produce a continuous layer of gold on the same surfaces. The quantity of gold deposited on the chip is on the order of one-fifth of the amount that is described as suitable for making good, ohmic contacts with gold on chips of GaAs by B. W. Hakki and S. Knight in their article entitled "Microwave Phenomena in Bulk GaAs," in IEEE Transactions on Electron Devices, Vol. ED-13, pages 94–105, Jan. 1966. Hence, the resistance of the contacts in chips of this invention was appreciably greater than the ohmic contacts described by Hakki et al. A substantial portion of the deposits of indium and gold were subsequently alloyed into the crystal (leaving, however, at least some of the deposited metals to serve as "electrodes") by rapidly heating the slice in a hydrogen-atmosphere furnace to a temperature of about 650° C., and then rapidly cooling, with the result that the material is above 200° C. for a period of about 2 minutes. The time/temperature history for this process is shown in FIG. 8. Thereafter, the slice was scribed and divided into sections 500 microns wide, thus providing chips 500 microns wide, 500 microns high and 1.0 mm. in length. The quality of the In-Au contacts was checked by plotting current/voltage characteristics at temperatures ranging from 17° to −38° C., both with and without sample illumination at low voltages. In all cases, the contacts were ohmic and independent of voltage polarity at low voltages.

The shelf life of the disclosed oscillators has been found to be very good. Oscillators which have been constructed and left idle for almost 1 year have been found to operate as satisfactorily as newly made oscillators.

Most attempts to fabricate Gunn-effect oscillators have been directed at attaining a uniform field distribution between the cathode and the anode when a voltage is applied therebetween. Thus, a plot of a good electric field versus distance across a crystal has usually been deemed to be a horizontal, straight line. With the doped crystals of this invention, however, a plot of the field distribution is characterized by higher values in the end regions and by a lower but fairly uniform value in the middle region, as shown in FIG. 2. This lack of uniform field distribution usually requires that clarification be made as to which portion of the crystal is being referred to. That is, unlike the electric field in conventional doped oscillators, the electric field in oscillators of this invention is best described in terms of three distinct portions of the oscillator, namely, the portion where domains originate (which is usually the cathode portion), the anode portion where travelling domains terminate, and the middle portion. The subscripts C (for cathode), A (for anode), and M (for middle) will often be used herein when it is desired to denote a specific portion of the oscillator.

During laboratory testing, the oscillators were mounted in a simple, optical-transmission cryocell such as that described by the present inventor in The Review of Scientific Instruments, Vol. 38, No. 8, page 1,166, Aug. 1967. The crystal-holder 11 (FIG. 3) was fitted with spring-loaded metal (brass) contacts 12, 13 for mounting the crystal 14 therebetween and within the central cavity of the tube 15. The spring 16 need not have any particularly unique characteristics; for example, a spring from an inexpensive ballpoint pen has been successfully employed in the location indicated. A non-resonant resistive circuit and a voltage-pulsing means capable of repetition rates of 120 pulses per second and capable of providing electrical fields across the oscillator in the range of 3,000 to 6,000 volts/centimeter were employed for effecting operation of the device. The GaAs crystals exhibited a frequency of oscillation of about 85 MHz at room temperature (25° C.). The devices were stable in their operation, and had sharp threshold voltages. They also were symmetrical with reversal of voltage polarity and ohmic at low voltages.

It was observed that if the devices were caused to oscillate in the dark with the cathode portion biased just slightly above the threshold level and the remainder of the oscillator being above the sustaining level, and if the light from the source was then positioned to illuminate only the cathode end of the oscillator, oscillations ceased. With the cathode portion of the crystal still illuminated, and an equal amount of illumination applied to the anode end of the crystal, oscillations resumed. The reverse type operation was obtained if the oscillator was biased in the dark such that the field in the cathode region was just slightly below the threshold level. In this latter case, initial illumination of the anode end of the crystal caused the oscillations to begin, and subsequent illumination of equal intensity at the cathode end caused the oscillations to cease. When the cathode region is initially biased slightly above a threshold level, the device will oscillate as long as the cathode end is not illuminated, regardless of whether the anode end is illuminated. Furthermore, it will oscillate with an illuminated cathode end, provided the anode end is also illuminated. The only condition under which it will not oscillate is when the cathode alone is illuminated.

Conversely, as long as the device is biased such that the field in the cathode end is slightly below threshold level, it will not oscillate as long as the anode end is not illuminated, regardless of the illumination at the cathode. Furthermore, it will remain in the non-oscillating state with an illuminated anode, provided the cathode end is also illuminated. The only condition under which it will oscillate is when the anode end alone is illuminated. The truth table of this operation is depicted graphical'y in FIG. 7. Slightly above and slightly below threshold field, in this sense, refers to percentages on the order of about 5 percent. For example, when the threshold voltage was 600 volts, raising the voltage to about 625 volts was sufficient to produce the effects described herein.

Figure 4:
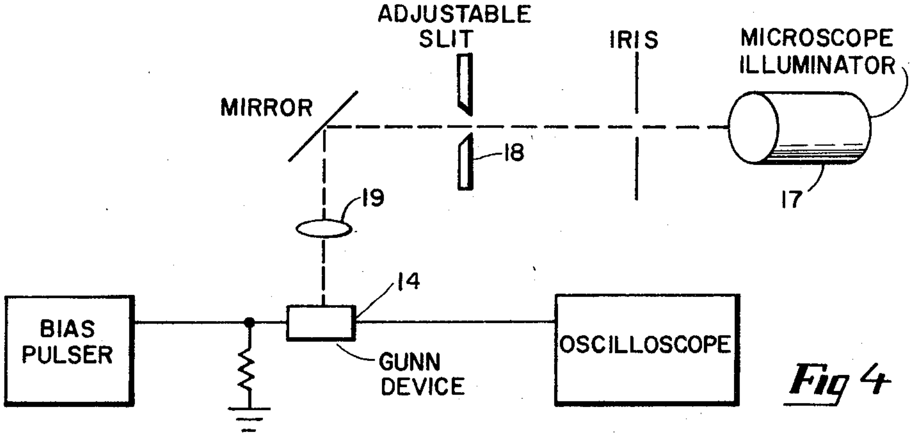
FIG. 4 is a schematic of an experimental arrangement which was employed to observe the phenomenon of selective frequency control by crystal illumination.

The experimental arrangement in which the phenomena were recorded is shown in FIG. 4. Light from a microscope illuminator 17 was focused through an adjustable slit 18 and then onto the crystal 14. The band of light thus obtained had a half-width of about 3 mils and spanned the width of the oscillator. The position of the light band was adjustable over the entire length of the oscillator by means of a movable lens 19.

It will readily be seen that this phenomena makes possible simple decision and logic devices in the form of a functional electronic block. For example, the device shown in FIG. 1 (when the cathode end is biased above threshold field, $E_t$) will register the presence of a light input at C only and ignore the inputs at A, as well as simultaneous inputs at C and A. On the other hand, when the cathode portion is biased below $E_t$, the device will register inputs at A only, and ignore singular inputs at C as well as simultaneous inputs at C and A. This is predicated on the assumption that inputs at C and A are of equal magnitude.

In the event that inputs at C and A are not of equal magnitude, the device is capable of distinguishing whether the input at C is greater than A or A greater than C, in accordance with whether the device is biased such that the field at C is above or below threshold level. For example, with the device biased such that $E_c$ is slightly above $E_t$, it will remain oscillating only if the optical input at A is equal to or greater than that at C, but will cease to oscillate if that at C becomes greater than that at A. On the other hand, if the device is biased such that the cathode field is slightly below $E_t$, it will remain in the non-oscillating state as long as the optical input at C is equal to or greater than that at A. A practical illustration of this phenomena is that a device made in accordance with this invention can be used to perform the function "IF (A not B)" which is commonly used in Fortran language. That is, it can discern if A is greater than B, if A is less than B, or if A is equal to B.

Figure 5:
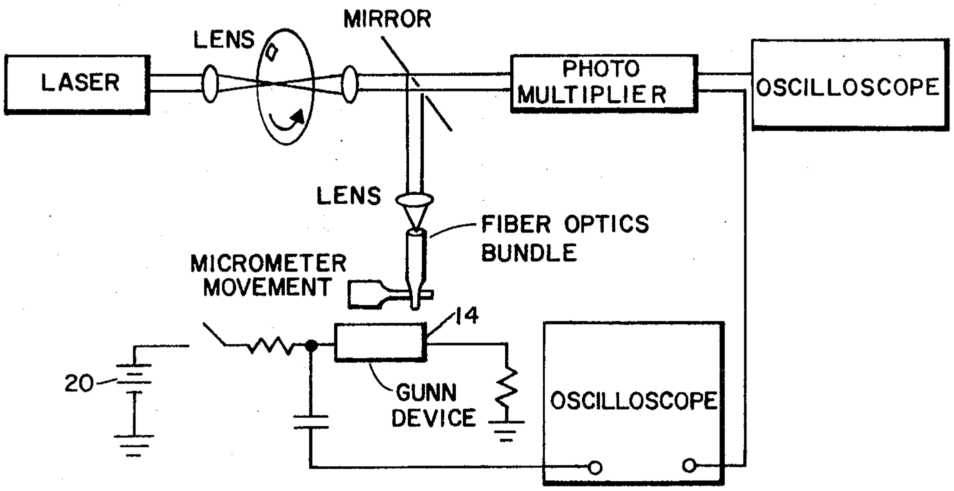
FIG. 5 is a schematic of an apparatus suitable for pulsing the output of a Gunn oscillator by pulsing the light incident on the oscillator.

It will also be seen that a gallium arsenide crystal, with its cathode region biased just slightly above the threshold field, provides a means for pulsing microwave oscillations by impinging a pulsed light-beam upon the cathode region of crystal. FIG. 5 represents, in block diagram form, apparatus suitable for this purpose. The apparatus comprises bias means 20 applied to a suitably doped Gunn oscillator 14 which is illuminated by a pulsed light source. When the illumination strikes the crystal, the oscillations are turned off; when the illumination ceases, the oscillations resume. The mode of operation is particularly advantageous since simple and economical means are available for rapidly pulsing light such as the chopper illustrated. The resulting pulsed microwave output may be directed to an antenna by suitable means, which may include a wave guide (not illustrated).

Without wishing to be necessarily bound by any theory expressed herein, an interpretation of the described observations begins with the recognition that an unusually high-resistance region exists in the crystal, adjacent the metal contacts. This localized high resistance is lowered somewhat when the region is illuminated, but it is still aptly described as relatively high. Attention to these high-resistance regions is justified because it was found that control of the oscillations as described herein was possible only when a narrow region of the GaAs chip near the contacts was illuminated. The type of oscillation control described herein was not achieved by illuminating the crystal only in the center thereof.

Tests with a photoresistance probe showed that the change in resistance due to illumination was greatly enhanced near the electrode. The high resistance regions at the contact caused a U-shaped electrical field distribution through the oscillator, as shown in FIG. 6, with the domain-forming and domain-terminating regions having an elevated profile. As is known, domains will form only if the generated electric field (at the region of domain formation) is greater than the threshold field, $E_t$. Once the domains are formed and begin to propagate, however, they will continue to propagate as long as the electric field is greater than the sustaining field, $E_s$, where $E_s$ is less than $E_t$. For the distribution shown in two of the three curves in FIG. 6, the electric field is greater than $E_t$ at the cathode and a domain will form and begin to propagate. Since the electric field in the remainder of the oscillator is above $E_s$, the domain will traverse the length of the device; and, when it terminates at the anode, a new domain will form. Continuous oscillation will therefore occur. If, however, the cathode is illuminated with sufficient intensity to reduce the resistance at that location so that the localized electric field at the cathode is no longer greater than $E_t$, no further domains will be formed and oscillations cease. Subsequently supplying appropriate illumination at the anode, however, will reduce the anode resistance and redistribute the electric field throughout the device; this raises the field at the cathode so that once again the localized field at the cathode is greater than $E_t$, and oscillation resumes.

Although the invention has been described with emphasis on an oscillator having an elevated resistance distribution profile at both the domain-forming and domain-terminating regions, it will be apparent that limited control may be obtained in an oscillator having an elevated resistance distribution profile at only the domain-forming region. In this modification, an electric field above the threshold level is applied to the Gunn-effect oscillator, thereby establishing traveling electric field domains. By controlling the relative light intensity impinging on the domain-forming region, control of the traveling electric field domains is possible.

While the devices described herein were constructed of N-type GaAs, it will be apparent to those skilled in the art that other semiconductor materials which are known to produce Gunn-effect oscillations could be substituted for the GaAs. According to various publications by Hakki, Gordon and others, suitable semiconductors should be substantially homogeneous, i.e., without any discernible P-N-rectifying junctions. Furthermore, the semiconductor's two energy bands should be separated by a sufficiently small energy level so that population redistribution can take place at field intensities that are not so high as to be destructive of the material. At zero field intensities, the carrier concentration in the lower energy band should be more than approximately 100 times that in the upper energy band at the temperature of operation. The mobility of carriers in the lower energy band should be more than approximately 5 times greater than the mobility in the upper energy band.

While only a few embodiments of inventions have been described in detail herein and shown in the accompanying drawing, it will be evident that various further modifications are possible in the arrangement and construction of its components without departing from the scope of the invention.

What is claimed is:

1. Apparatus comprising:

a semiconductor crystal of the Gunn-effect type doped to have internally formed therein traveling electric field domains which propagate to termination in response to an applied electric field above a threshold level, said crystal characterized by having an elevated resistance profile at the domain-forming and domain-terminating regions thereof;

means for generating an electric field in said crystal controllable from below the threshold level to above the threshold level at the domain-forming region to control the formation of the traveling electric field domains;

means for directing light to the domain-forming region of said crystal and for controlling the relative light intensity impinging thereon to control the traveling electric field domains in conjunction with the generated electric field; and means for directing light to the domain-terminating region of said crystal and for controlling the relative light intensity impinging thereon to further control the formation of traveling electric field domains in conjunction with the generated electric field and the relative light intensity impinging on the domain-forming region.

2. Apparatus as set forth in claim 1 including means for selectively illuminating the domain-forming and domain-terminating regions of said crystal.

3. Apparatus as set forth in claim 1 wherein said means for generating an electric field includes a variable DC source connected to electrodes at opposite ends of said crystal.

4. Apparatus as set forth in claim 1 including:

means responsive to the traveling electric field domains in said crystal to indicate the presence of illumination at the domain-forming and domain-terminating regions under selected electric field conditions.

5. Apparatus as set forth in claim 1 including means responsive to the traveling electric field domains in said crystal to determine the difference in the magnitude of illumination at the domain-forming region and the domain-terminating region under various electric field conditions.

6. The method of controlling the traveling electric field domains in a crystal of the Gunn-effect type characterized by having an elevated resistance profile at the domain-forming and domain-terminating regions thereof, comprising the steps of:

generating an electric field in said crystal above the threshold level at the domain-forming region to establish traveling electric field domains in relative darkness;

selectively illuminating the domain-forming region of said crystal to promote lowering of the electric field at that region below the threshold level so as to inhibit the formation of traveling electric field domains; and illuminating the domain-terminating region to further effect the electric field distribution in the crystal so as to further control the traveling electric field domains in conjunction with the illumination of the domain-forming region.

7. The method of controlling traveling electric field domains as set forth in claim 6 wherein the light which is incident on at least one of the illuminated regions is of variable intensity.

* * * * *